(12) United States Patent
Zhang et al.

(10) Patent No.: US 10,665,145 B2
(45) Date of Patent: May 26, 2020

(54) LOW-VOLTAGE DIGITAL TO ANALOG SIGNAL CONVERSION CIRCUIT, DATA DRIVING CIRCUIT AND DISPLAY SYSTEM

(71) Applicant: Peking University Shenzhen Graduate School, Guangdong (CN)

(72) Inventors: Shengdong Zhang, Guangdong (CN); Chuanli Leng, Guangdong (CN); Xingwu Lin, Guangdong (CN)

(73) Assignee: Peking University Shenzhen Graduate School, Guangdong (CN)

( * ) Notice: Subject to any disclaimer, the term of this patent is extended or adjusted under 35 U.S.C. 154(b) by 0 days.

(21) Appl. No.: 15/568,975

(22) PCT Filed: Mar. 24, 2016

(86) PCT No.: PCT/CN2016/077262
§ 371 (c)(1),
(2) Date: Oct. 24, 2017

(87) PCT Pub. No.: WO2016/169383
PCT Pub. Date: Oct. 27, 2016

(65) Prior Publication Data
US 2018/0130392 A1 May 10, 2018

(30) Foreign Application Priority Data
Apr. 24, 2015 (CN) .......................... 2015 1 0200983

(51) Int. Cl.
*G09G 3/20* (2006.01)
*H03M 1/68* (2006.01)
(Continued)

(52) U.S. Cl.
CPC ............... *G09G 3/20* (2013.01); *H03M 1/66* (2013.01); *H03M 1/682* (2013.01); *H02M 2001/0093* (2013.01); *H03M 1/765* (2013.01)

(58) Field of Classification Search
CPC ... G05F 1/10; G05F 1/46; G05F 3/262; G05F 1/56; G09G 3/20
See application file for complete search history.

(56) References Cited

U.S. PATENT DOCUMENTS 6,707,404 B1 * 3/2004 Yilmaz ............... H03M 1/1061
341/120
7,414,561 B1 * 8/2008 Brubaker ............ H03M 1/0682
341/145
(Continued)

FOREIGN PATENT DOCUMENTS

| CN | 1913364 A | 2/2007 |
|---|---|---|
| CN | 101145781 A | 3/2008 |
| CN | 101702624 A | 5/2010 |

OTHER PUBLICATIONS

PCT Search Report and Written Opinion dated Jan. 7, 2016, International Application No. PCT/CN2016/077262, filed Mar. 24, 2016, 7 pages.

(Continued)

*Primary Examiner* — Olga V Merkoulova
(74) *Attorney, Agent, or Firm* — Lee & Hayes, P.C.

(57) ABSTRACT

The present application discloses a low-voltage digital to analog conversion circuit, a data driving circuit and a display system. At least one voltage dividing unit comprises a number of resistors connected in series between a lower limit of voltage and an upper limit of voltage, and voltage dividing output terminals drawn from the resistors' connection nodes and an upper limit of voltage connection end. Introducing the voltage dividing unit renders the low-voltage digital signal to analog signal conversion circuit, the data driving circuit, and the display system low-voltage devices with low power consumption and small chip area.

10 Claims, 7 Drawing Sheets

(51) Int. Cl.
  *H03M 1/66*  (2006.01)
  *H03M 1/76*  (2006.01)
  *H02M 1/00*  (2006.01)

(56) References Cited

U.S. PATENT DOCUMENTS

| | | | | |
|---|---|---|---|---|
| 8,462,145 B2* | 6/2013 | Kim | ............... | G09G 3/3648 |
| | | | | 345/208 |
| 8,476,971 B2* | 7/2013 | Peng | ............... | G09G 3/3688 |
| | | | | 327/560 |
| 8,514,157 B2* | 8/2013 | Tsuchi | ............ | G09G 3/3688 |
| | | | | 345/30 |
| 8,941,522 B2* | 1/2015 | Medina Sanchez-Castro | ............ | |
| | | | | H03M 1/687 |
| | | | | 341/153 |
| 2006/0006928 A1* | 1/2006 | Utsuno | ............ | G09G 3/3688 |
| | | | | 327/541 |
| 2009/0046083 A1* | 2/2009 | Kim | ............... | G09G 3/20 |
| | | | | 345/204 |
| 2014/0085985 A1* | 3/2014 | Pan | ............... | G11C 5/145 |
| | | | | 365/185.18 |
| 2015/0332638 A1* | 11/2015 | Li | ............... | G09G 3/3648 |
| | | | | 345/214 |
| 2015/0348492 A1* | 12/2015 | Park | ............... | G09G 3/3666 |
| | | | | 345/205 |

OTHER PUBLICATIONS

CN Office Action dated Aug. 2, 2017, China Patent Application No. CN201510200983.8, filed Apr. 24, 2015.

* cited by examiner

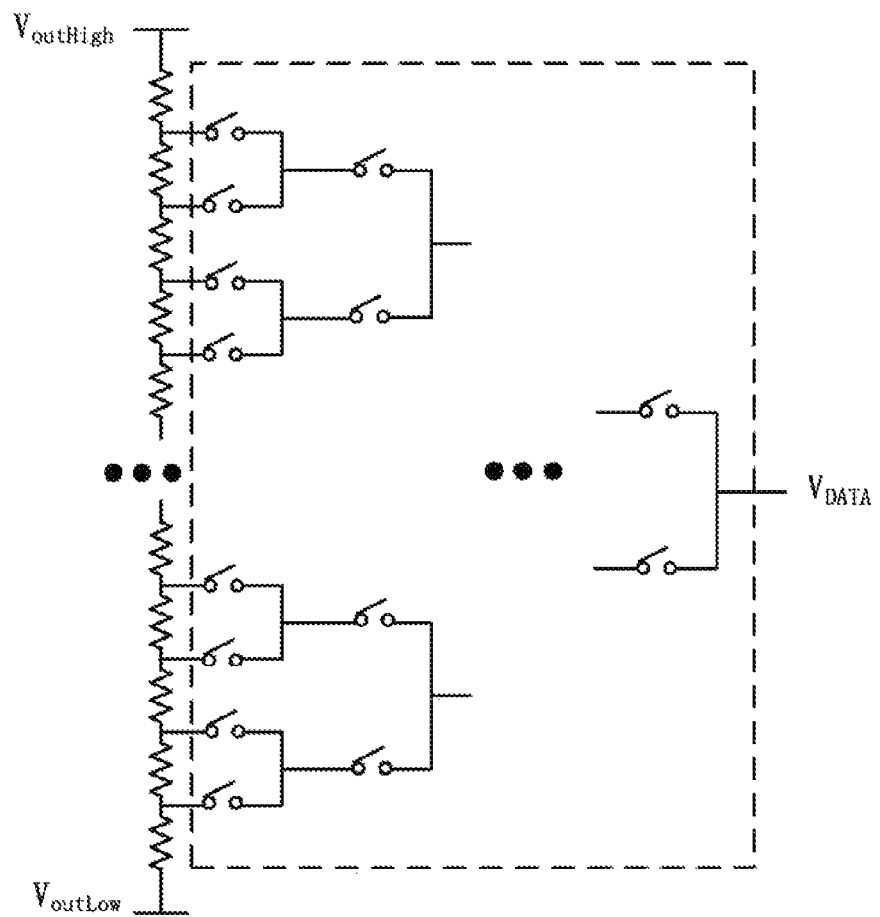
Figure 1 – PRIOR ART
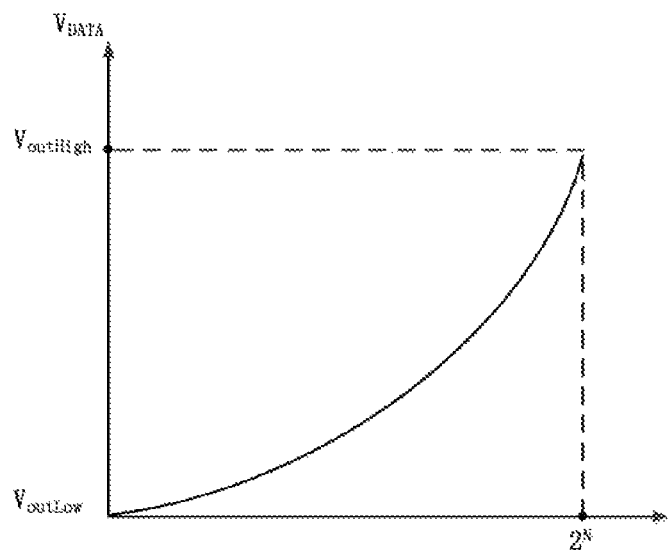
Figure 2 – PRIOR ART

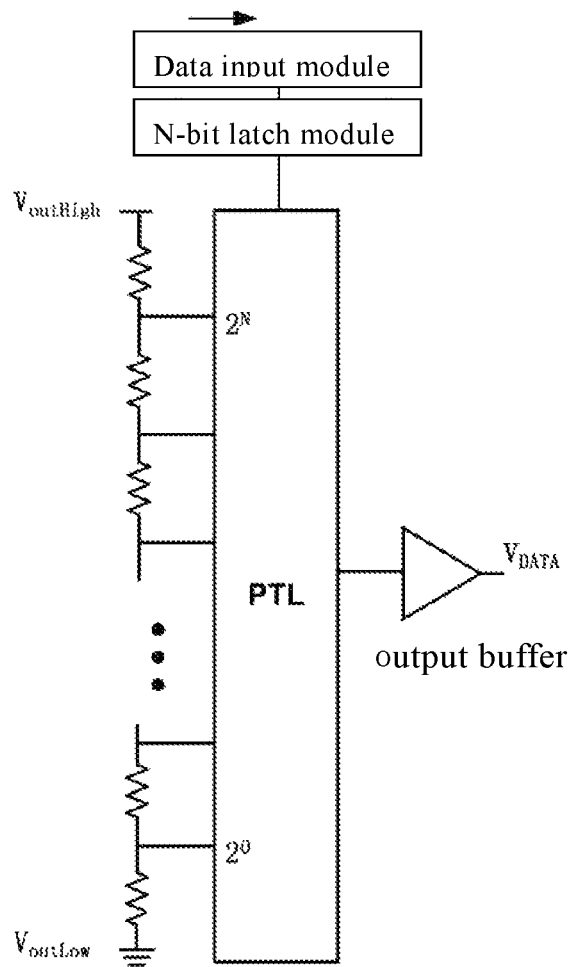
Figure 3 – PRIOR ART
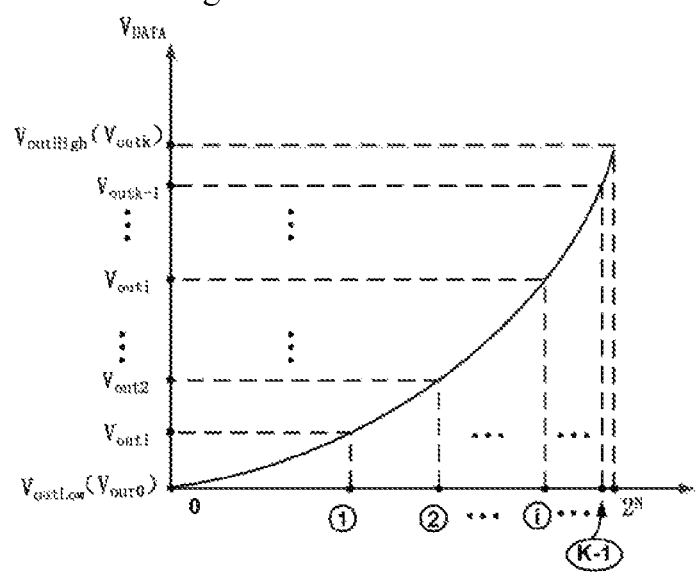
Figure 4

LOW-VOLTAGE DIGITAL TO ANALOG SIGNAL CONVERSION CIRCUIT, DATA DRIVING CIRCUIT AND DISPLAY SYSTEM

CROSS REFERENCE TO RELATED APPLICATIONS

This application is a 35 USC § 371 filing of International Application No. PCT/CN2016/077262, filed Mar. 24, 2016, entitled LOW-VOLTAGE DIGITAL-TO-ANALOG SIGNAL CONVERSION CIRCUIT, DATA DRIVING CIRCUIT, AND DISPLAY SYSTEM, which claims the benefit of China Patent Application No. CN201510200983.8, filed Apr. 24, 2015, entitled LOW-VOLTAGE DIGITAL-TO-ANALOG SIGNAL CONVERSION CIRCUIT, DATA DRIVING CIRCUIT, AND DISPLAY SYSTEM, which are incorporated herein by reference.

TECHNICAL FIELD

Aspects of the present disclosure relate to display technology, and more particularly to a digital to analog converter, a data driving circuit and a display system for implementation of display with a low cost.

BACKGROUND

Display systems, as a medium for delivering information, are closely related to everyday life. The mainstream display system now is the liquid crystal (LCD) display system. Besides, the active matrix organic light emitting diode (AMOLED) display system begins to emerge in field of small size display. Both the LCD display system and the OLED display system need to convert a digital signal representing image information to an analog signal for displayed on a panel. This requires a digital to analog converter (DAC). In a display system, the design of DAC is the core module in a column driving chip. In a display system, as illustrated in FIG. 1, DAC adopts a resistor string to generate voltages required by each gray scale. A pass transistor logic (PTL) is used to select the gray scale voltage corresponding to the digital signal input to DAC. If a display system has 256 levels of gray scale, then 256 resistors are needed to generate 256 different voltages.

In LCD and OLED display systems, an analog signal used to drive a display screen is a middle-high voltage signal. The analog signal of the middle-high voltage is selected from the voltages divided by the above mentioned resistor string of DAC, which causes a middle-high voltage is applied to the resistor string. As a result, it is required that related devices including the pass transistor logic (PTL) in DAC are middle-high voltage devices. However, middle-high voltage devices have higher power consumption and occupy more chip area.

SUMMARY

According to a first aspect, the present application provides a low-voltage digital to analog conversion circuit, comprising: at least one voltage dividing unit (10), comprising a number of resistors connected in series between a lower limit of voltage and a upper limit of voltage, and voltage dividing output terminals drawn from the resistors' connection nodes and the connection end of the upper limit of voltage; a selection unit (11), coupled to the voltage dividing output terminals of each voltage dividing unit (10), the selection unit (11) is configured to input a digital signal, select to activate one from the voltage dividing output terminals under the control of the digital signal, and output a voltage signal to be compensated at the voltage dividing output terminal; a voltage compensation unit (12), coupled to the selection unit (11) and configured to input the voltage signal to be compensated and the digital signal respectively, and to compensate the voltage signal to be compensated according to the digital signal, so that the compensated voltage is an analog voltage corresponding to the digital signal.

According to a second aspect, the present application provides a data driving circuit, comprising: a data input module configured to input a digital signal comprising image data; a latch coupled to the data input module configured to lock the digital signal; aforementioned low-voltage digital to analog conversion circuit, input terminals of the selection unit (11) and the voltage compensation unit (12) thereof are coupled to an output terminal of the latch.

According to a third aspect, the present application provides a display system comprising the aforementioned data driving circuit.

Introducing the voltage dividing unit, which comprises a number of resistors connected in series between a lower limit of voltage and a upper limit of voltage and a voltage dividing output terminal drawn from the resistors' connection nodes and a upper limit of voltage connection end, renders the low-voltage digital signal to analog signal conversion circuit, the data driving circuit, and the display system low-voltage devices with low power consumption and occupying small chip area.

BRIEF DESCRIPTION OF THE DRAWINGS

FIG. 1 illustrates a structure diagram of a traditional resistor string and a pass transistor logic.

FIG. 2 illustrates a Gamma curve when a traditional digital to analog converter involved in the display process.

FIG. 3 illustrates a structure diagram of a traditional digital to analog converter implemented by a resistor string.

FIG. 4 illustrates a Gamma curve of a low-voltage digital signal to analog signal conversion circuit according to one embodiment of the present application.

DETAILED DESCRIPTION

Figure 5:
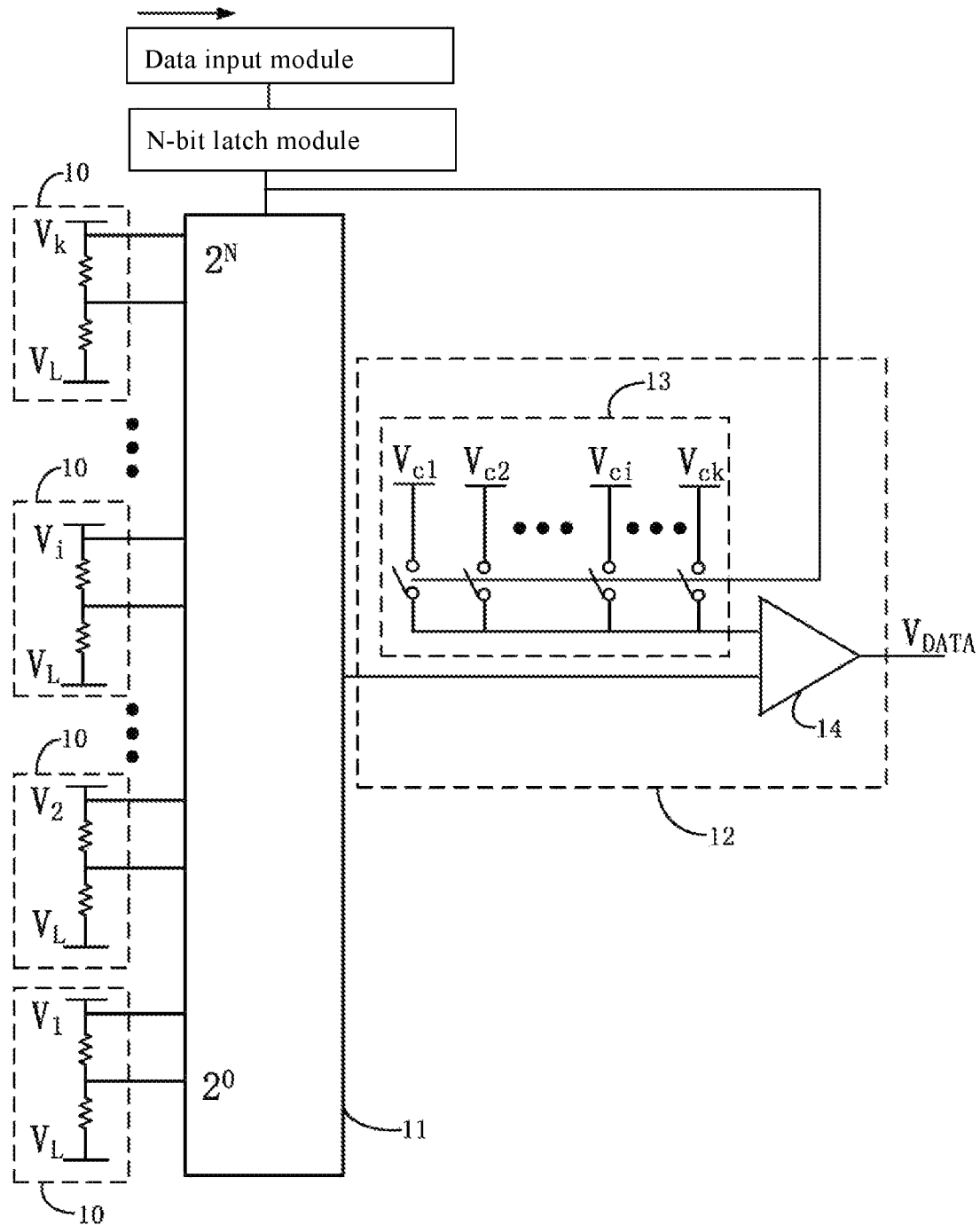
FIG. 5 illustrates a structure diagram of a low-voltage digital signal to analog signal conversion circuit implemented in the present application.

The present application is explained in detail below according to the embodiments in connection with the appended drawings.

Please refer to FIG. 2, which illustrates a Gamma curve of a N-bit digital to analog converter, where N is a positive integer. As can be seen from FIG. 2, while the input digital signal changes from $2^0$ to $2^N$, the voltage of the signal output by the digital to analog converter ranges from $V_{outLow}$ to $V_{outHigh}$. The values $V_{outLow}$ and $V_{outHigh}$ of are determined by the luminance range, pixel circuit, and liquid crystal molecule characteristic and so forth of the LCD or OLED panel.

Please refer to FIG. 3, which illustrates a module structure of a group of column driving circuits. The column driving circuit comprises a data input module (usually a shift register module), a latch module, a digital to analog conversion module, and an output buffer. The digital to analog conversion module comprises a resistor string and a pass transistor logic (PTL). Both the latch module and the digital to analog conversion module are N-bit. Therefore, in the digital to analog conversion module, there are $2^N$ different voltage values in the range of $V_{outLow}$~$V_{outHigh}$ which are generated by voltage division of resistors in the resistor string. $2^N$ different voltage values generated by the resistor string can be shared by chips in the column driving circuit. Each digital to analog converter uses its pass transistor logic (PTL) to select one from $2^N$ different voltage values as the output of the digital to analog converter. An N-bit digital signal representing image data is output by the input module and the latch module. This output serves as the input of the pass transistor logic (PTL) of the digital to analog converter. The N-bit digital signal determines the value of its output signal, so as to achieve the digital to analog conversion. The analog signal output by the digital to analog converter is then transmitted to the panel through the output buffer to achieve image display.

The present application discloses a low-voltage digital to analog conversion circuit, a data driving circuit and a display system. The concept is that: by dividing the above resistor string into a number of segmented resistor strings, i.e., voltage dividing units, one end of each voltage dividing unit is connected to the low voltage, i.e., the lower limit of voltage, usually 0, so as to decrease the voltage value of the output of each voltage dividing unit.

Specifically, an N-bit digital signal is input to the low-voltage digital signal to analog signal conversion circuit (hereinafter referred to as "the low-voltage digital to analog conversion circuit" for simplicity) disclosed in this application, and correspondingly, the output is an analog signal with voltage range of $V_{outLow}$~$V_{outHigh}$, wherein $V_{outHigh}$>$V_{outLow}$, and N is a positive integer. FIG. 4 illustrates a Gamma curve of the instant low-voltage digital to analog converting circuit, wherein the horizontal axis represents the input N-bit digital signal, and the vertical axis represents corresponding output analog signal with voltage range of $V_{outLow}$~$V_{outHigh}$.

Please refer to FIG. 5. the low-voltage digital to analog conversion circuit comprises:

at least one voltage dividing unit 10 which comprises a number of resistors connected in series between the lower limit of voltage and the upper limit of voltage, and voltage dividing output terminals drawn from the resistors' connection nodes and the connection end of the upper limit of voltage. It should be noted that, the upper limit of voltage of some voltage dividing units 10 has no corresponding digital signal. In this situation, there is no need to draw a voltage dividing output terminal from the upper limit of voltage of the voltage dividing unit 10, but draw a number of voltage dividing output terminals directly from the resistors' connection nodes of this voltage dividing unit 10;

a selection unit 11, which is connected to the voltage dividing output terminals of each voltage dividing unit 10. The selection unit 11 is configured to be input a digital signal, select one from the voltage dividing output terminals under the control of the digital signal, and output a voltage signal to be compensated from the selected voltage dividing output terminal. The selection unit 11 can comprise a pass transistor logic. The switch circuits formed by pass transistor logic have a one-to-one correspondence relationship with the voltage dividing output terminals of voltage dividing units 10, with the voltage dividing output terminals reciprocally connected to the output terminals of the selection unit 11. Preferably, there are at least two voltage dividing units 10. To further reduce the voltage applied on each voltage dividing unit 10, the lower limit of voltage of each voltage dividing unit 10 may be set to 0 when designing the instant low-voltage digital to analog conversion circuit. In addition, to achieve a better effect, the upper limits of voltage of all voltage dividing units 10 may be as close as possible when designing each voltage dividing unit 10;

a voltage compensation unit 12, which is connected to the selection unit 11 configured to be input the voltage signal to be compensated and the digital signal respectively and to compensate the voltage signal to be compensated according to the digital signal, so that the compensated voltage is the analog voltage corresponding to the digital signal. The voltage compensation unit 12 determines the compensation value of the voltage signal to be compensated according to the digital signal and the division rule of the voltage dividing unit 10, and generates its output after adding the voltage to be compensated to the compensation value.

The voltage compensation unit 12 has many implementation ways, and some examples are shown below.

The voltage compensation unit 12 comprises a compensation voltage selection module 13 and an analog adder module 14.

The compensation voltage selection module 13 is configured to output a compensation signal according to the digital signal and the division rule of the voltage dividing unit 10. The compensation signal is used to compensate the voltage signal to be compensated. The compensation voltage selection module 13 may comprise compensation voltage terminals and switch modules. Specifically, the number of the compensation voltage terminals is the same as that of the voltage dividing units 10, and the voltage values at the compensation voltage terminals are equal to the voltage values required by the voltage signals to be compensated at the voltage dividing output terminal of each voltage dividing unit 10. The number of the switch modules is the same as that of the compensation voltage terminals. One switch module is only connected to one compensation voltage terminal. One end of the switch module is connected to the compensation voltage terminal, and the other end is connected to an input terminal of the analog adder module 14. A control terminal of the switch module is used to input the digital signal and to turn on or off the switch module under the control of the digital signal, so as to output the compensation signal.

An input terminal of the analog adder module 14 is connected to the output terminal of the selection unit 11 and the other input terminal is connected to the output terminal of the compensation voltage selection module 13. The analog adder module 14 is used to add the voltage signal to be compensated output by the selection unit 11 to the voltage of the compensation signal output by the compensation voltage selection module 13 and then output the result. The signal output from the analog adder module 14 is the output signal of the voltage compensation unit 12. The analog adder module 14 has many structures, and here are some examples.

According to a first structure, the analog adder module 14 comprises an amplifier and a number of input capacitors.

Figure 6:
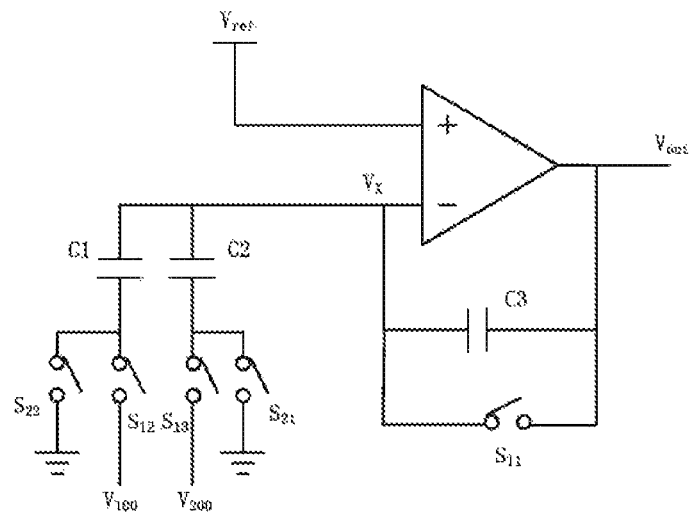
FIG. 6 illustrates a structure diagram of an analog adder module comprising a number of input capacitors according to one embodiment of the present application.

Please refer to FIG. 6. Specifically, the analog adder module 14 comprises capacitors C1, C2, and C3, and an amplifier, wherein $V_{100}$ and $V_{200}$ represent the two inputs of the analog adder module 14, and $V_{out}$ represents the output of the analog adder module 14. The connections are as follows.

The positive input terminal of the amplifier is grounded, and the capacitor C3 is connected between the negative input terminal and the output terminal of the amplifier. A switch $S_{11}$ is connected in parallel with the capacitor C3. The negative input terminal of the amplifier is connected to a switch $S_{22}$ which is grounded through the capacitor C1, the end of the capacitor C1 connected to the grounded switch $S_{22}$ is also connected to one end of another switch $S_{12}$, and the other end of the switch $S_{12}$ is connected to an input terminal of the analog adder module 14. The negative input terminal of the amplifier is also connected to a grounded switch $S_{21}$ through the capacitor C2. The end of the capacitor C2 connected to the grounded switch $S_{21}$ is also connected to one end of another switch $S_{13}$, and the other end of the switch $S_{13}$ is connected to the other input terminal of the analog adder module 14.

The work process of the analog adder module 14 has two stages.

At the first stage, switches $S_{11}$, $S_{12}$, and $S_{13}$ are turned on, and switches $S_{21}$ and $S_{22}$ are turned off. In this situation, $V_{100}$ and $V_{200}$ are respectively coupled to the first ends of capacitors C1 and C2. The negative input terminal of the amplifier is connected to the output terminal of the amplifier. The charge at the negative input terminal can be expressed as:

$$Q_1=(V_X-V_{100})*C1+(V_X-V_{100})*C2$$

At the second stage, switches $S_{21}$ and $S_{22}$ are turned on, and switches $S_{11}$, $S_{12}$, and $S_{13}$ are turned off In this situation, the first ends of capacitors C1 and C2 are respectively coupled to ground. In this process, the negative input terminal of the amplifier is floating, and the charge at the negative input terminal remains the same and can be expressed as:

$$Q_1=V_X*C1+V_X*C2+(V_X-V_{out})*C3$$

According to the charge expressions of the amplifier's negative input terminal in the first and the second stages, the following expression can be obtained:

$$V_{out}=V_X+(V_{100}*C1+V_{200}*C2)C3$$

If C1=C2=C3, according to the virtual short principle of the negative input terminals of the amplifier: $V_{ref}=V_X$, then the following equation can be obtained:

$$V_{out}=V_{ref}+V_{100}+V_{200},$$

when $V_{ref}=0$, it can be obtained that $V_{out}=V_{100}+V_{200}$. Hence, the function of adding voltages is achieved.

Figure 7:
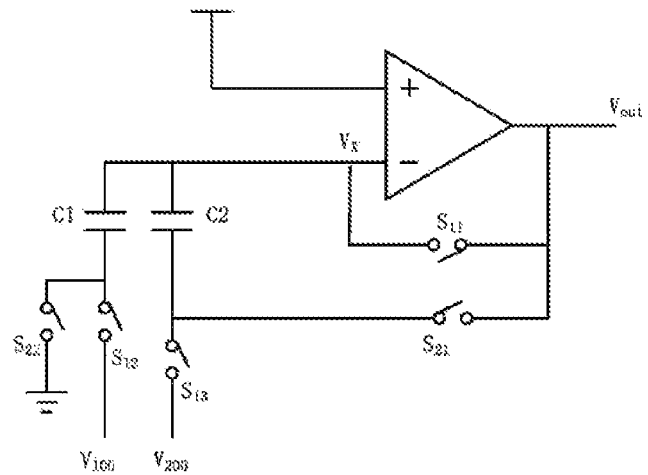
FIG. 7 illustrates another structure diagram of an analog adder module comprising a number of input capacitors according to one embodiment of the present application.

Please refer to FIG. 7. Specifically, the analog adder module 14 may not comprise the capacitor C3 but may comprise capacitors C1, C2 and an amplifier, wherein $V_{100}$ and $V_{200}$ represent two inputs of the analog adder module 14, and $V_{out}$ represents the output of the analog adder module 14. The connections are as follows.

The positive input terminal of the amplifier is grounded, and a switch $S_{11}$ is connected between the negative input terminal and the output terminal of the amplifier. The negative input terminal of the amplifier is connected to one end of the capacitor C2, and the other end of the capacitor C2 is connected to the output terminal of the amplifier through a switch $S_{21}$. The end of the capacitor C2 which is connected to one end of the switch $S_{21}$ is also connected to one end of a switch $S_{13}$. The other end of the switch $S_{13}$ is an input terminal of the analog adder module 14. The negative input terminal of the amplifier is also connected to a grounded switch $S_{22}$ through the capacitor C1. The end of the capacitor C1 connected to the grounded switch $S_{22}$ is also connected to one end of another switch $S_{12}$. The other end of the switch $S_{12}$ is the other input terminal of the analog adder module 14.

Similarly, the work process of the analog adder module 14 has two stages.

At the first stage, switches $S_{11}$, $S_{12}$, and $S_{13}$ are turned on, and switches $S_{21}$ and $S_{22}$ are turned off. In this situation, $V_{100}$ and $V_{200}$ are respectively coupled to the first ends of capacitors C1 and C2. The negative input terminal of the amplifier is connected to the output terminal of the amplifier. The charge at the negative input terminal can be expressed as:

$$Q_1(V_X-V_{100})*C1+(V_X-V_{200})*C2$$

At the second stage, switches $S_{21}$ and $S_{22}$ are turned on, and switches $S_{11}$, $S_{12}$, and $S_{13}$ are turned off In this situation, the first ends of capacitors C1 and C2 are respectively coupled to ground and the output terminal of the amplifier. In this process, the negative input terminal of the amplifier is floating, and the charge at the negative terminal remains the same and can be expressed as:

$$Q_1=V_X*C1+(V_X-V_{out})*C2$$

According to the charge expressions of the amplifier negative input terminal in the first and the second stages, the following expression can be obtained:

$$V_{out}=V_{200}+(V_{100}*C1)/C2$$

If C1=C2, then $V_{out}=V_{100}+V_{200}$. Hence, the function of adding voltages is achieved.

Switches $S_{11}$, $S_{12}$, $S_{13}$, $S_{21}$, and $S_{22}$ in FIG. 6 and FIG. 7 refer to devices with switch function.

According to the second structure, the analog adder module 14 comprises an amplifier and a number of input resistors.

Figure 8:
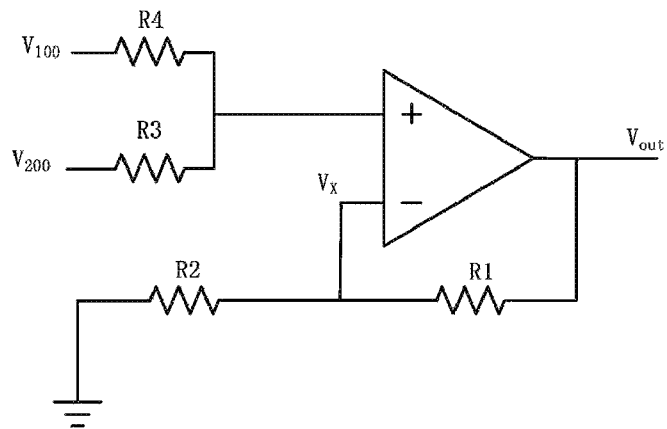
FIG. 8 illustrates a structure diagram of an analog adder module comprising a number of input resistors according to one embodiment of the present application.

Please refer to FIG. 8. Specifically, the analog adder module 14 comprises four resistors and an amplifier, wherein $V_{100}$ and $V_{200}$ represent the two inputs of the analog adder module 14, and $V_{out}$ represents the output of the analog adder module 14. The connections are as follows.

A resistor R1 is connected between the negative input terminal and the output terminal of the amplifier. The negative input terminal of the amplifier is also connected to a grounded resistor R2. The positive input terminal of the amplifier is connected to one end of a resistor R3, and the other end of the resistor R3 is connected to an input terminal of the analog adder module 14. The positive input terminal of the amplifier is connected to one end of a resistor R4, and the other end of the resistor R4 is connected to the other input of the analog adder module 14, wherein the resistances of the resistors R2, R3, and R4 are equal to each other, and the resistance of the resistor R1 is twice of the resistance of the resistor R2, i.e., 2*R.

The formula for calculating voltage at the positive input terminal of the current amplifier is: $(V_{100}-V_X)/R=(V_X-V_{200})/R$, then the voltage of the positive input terminal of the amplifier is: $V_X=(V_{100}+V_{200})/2$. Combining with another formula $V_X=(V_{out}/2R)*R=V_{out}/2$, $V_{out}=V_{100}+V_{200}$ is obtained. Hence, the function of adding voltages is achieved.

According to a third structure, the analog adder module 14 comprises a voltage-to-current conversion module and a current-to-voltage conversion module.

Figure 9:
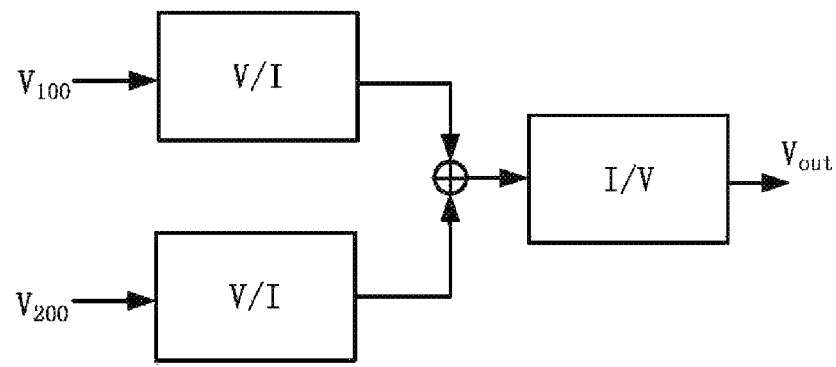
FIG. 9 illustrates a structure diagram of an analog adder module comprising a voltage-to-current conversion module and a current-to-voltage conversion module according to one embodiment of the present application.

Please refer to FIG. 9. Specifically, the analog adder module 14 comprises:

two voltage-to-current conversion modules; the input terminal of one voltage-to-current conversion module is connected to an input terminal of the analog adder module 14 for converting the voltage signal to be compensated output by the selection unit 11 to a current signal for output. If the voltage signal output by the selection unit 11 is $V_{100}$, after it being input into the voltage-to-current conversion module, the output current may be $V_{100}*g_m$, wherein $g_m$ is the transconductance of the voltage-to-current conversion module. The input terminal of the other voltage-to-current conversion module is connect to the other input terminal of the analog adder module 14 for converting the compensation signal output by the compensation voltage selection module 13 to a current signal for output. If the voltage signal output by the compensation voltage selection module 13 is $V_{200}$, the output current may be $V_{200}*g_m$ after it being input into the voltage-to-current conversion module;

an adder node, configured to add the current signals output by the two voltage-to-current conversion modules for output, which means adding $V_{100}*g_m$ to $V_{200}*g_m$, and outputting a current signal with a value of $(V_{100}+V_{200})*g_m$;

a current-to-voltage conversion module, whose output terminal is the output terminal of the analog adder module 14, configured to convert the current signal output by the adder node to a voltage signal for output, which means converting the input current signal with a value of $(V_{100}+V_{200})*g_m$ to $V_{100}+V_{200}$. Hence, the function of adding voltages is achieved. Since current addition is easier to achieve by flowing currents to be added to a same node, the issue of voltage addition is converted to the issue of current addition by converting voltage to current, which renders easier implementation.

On basis of the low-voltage digital to analog conversion circuit, the present application also provides a data driving circuit, which comprises:

a data input module for inputting a digital signal comprising image data;

a latch, which is coupled to the data input module for locking the digital signal;

the above low-voltage digital to analog conversion circuit, with the input terminals of the selection unit 11 and the voltage compensation unit 12 thereof being connected to the output terminal of the latch.

Further, the present application also provides a display system, which comprises the above data driving circuit.

Embodiment I

This embodiment further explains the above low-voltage digital to analog conversion circuit, especially the issues of the lower limit of voltage and the upper limit of voltage to which each voltage dividing unit 10 is coupled and the voltage of the compensation signal output by the voltage compensation unit 12.

Please refer back to FIG. 4. A N-bit digital signal is input to the low-voltage digital to analog conversion circuit disclosed in this application, and correspondingly, the output is an analog signal with voltage range of $V_{outLow}$~$V_{outHigh}$.

Please refer back to FIG. 5. The low-voltage digital to analog conversion circuit comprises:

k voltage dividing units 10, wherein one end of the ith voltage dividing unit is connected to a low voltage $V_L$ (i.e., the lower limit of voltage), and the other end is connected to a voltage end (i.e., the upper limit of voltage) with the value of $V_i$ for outputting a signal with a range of $V_L$~$V_i$; wherein k is a positive integer greater than 1, and i is a positive integer less than or equal to k. In other words, one end of the first voltage dividing unit 10 is connected to a low voltage $V_L$, and the other end is connected to a voltage end with the value of $V_1$ for outputting a signal with a range of $V_L$~$V_1$; one end of the second voltage dividing unit 10 is connected to a low voltage $V_L$, and the other end is connected to a voltage end with the value of $V_2$ for outputting a signal with a range of $V_L$~$V_2$, and so forth. In a similar fashion, one end of the kth voltage dividing unit 10 is connected to a low voltage $V_L$, and the other end is connected to a voltage end with the value of $V_k$ for outputting a signal with a range of $V_L$~$V_k$. In addition, the voltage dividing unit 10 in FIG. 5 includes two resistors connected in series. However, this is simply for illustration, and it does not mean that each voltage dividing units 10 includes two resistors;

a selection unit 11, configured to select a signal with a voltage value of a voltage dividing unit for output according to the input N-bit digital signal. In other words, the input terminal of the selection unit 11 receives an N-bit digital signal, and outputs a voltage signal by selecting a value from a voltage output range of a voltage dividing unit 10 among the k voltage dividing units 10 according to the digital signal. For example, the selection unit 11 outputs a voltage signal by selecting a value from the voltage output range $V_L$~$V_2$ of the second voltage dividing unit 10 according to the digital signal;

a voltage compensation unit 12, configured to when the selection unit 11 selects to output a signal with a voltage value of the ith voltage dividing unit 10, compensate the signal output by the pass transistor logic 11 with a voltage value $V_{ci}$ and then output the compensated signal. The reason for compensation is because one end of the voltage dividing unit 10 is connected to the low level voltage $V_L$, therefore, the portion of voltage that is pulled down should be added back. The signal output by the voltage compensation unit 12 is the output signal of the low-voltage digital to analog conversion circuit. The output analog signal is then transmitted to a panel by an output buffer for display of the image. When the selection unit 11 selects to output a signal with a voltage value of the first voltage dividing unit, the voltage compensation unit 12 compensates the signal output by the selection unit 11 with a voltage value $V_{c1}$ and then outputs the compensated signal. When the selection unit 11 selects to output a signal with a voltage value of the second voltage dividing unit, the voltage compensation unit 12 compensates the signal output by the selection unit 11 by a voltage value $V_{c2}$ and then outputs the compensated signal, and so forth. In a similar fashion, when the selection unit 11 selects to output a signal with a voltage value of the kth voltage dividing unit, the voltage compensation unit 12 compensates the signal output by the selection unit 11 with a voltage value of $V_{ck}$ and then outputs the compensated signal. In addition, compensating the signal output by the selection unit 11 with a voltage value $V_{ci}$ means that, if the voltage value of the signal output by the selection unit 11 is $V_{out}$, after the voltage compensation with a value of $V_{ci}$, the voltage value of the final output signal is $V_{out}+V_{ci}$.

According to one structure of the voltage compensation unit 12, it comprises a compensation voltage selection module 13 and an analog adder module 14. Detailed descriptions are as follows.

The compensation voltage selection module 13 is configured to when the selection unit 11 selects to output a signal with a voltage value of the ith voltage dividing unit 10, output a compensation signal with a voltage value of $V_{ci}$. For example, when the selection unit 11 selects to output a signal with a voltage value of the first voltage dividing unit, the compensation voltage selection module 13 outputs a compensation signal with a voltage value of $V_{c1}$. The compensation voltage selection module 13 may comprise k compensation voltage terminals and k switch modules. Among the k compensation voltage terminals, the value at the ith compensation voltage terminal is $V_{ci}$, wherein i is a positive integer less than or equal to k. That is, the value at the first compensation voltage terminal is $V_{c1}$, and the value at the second compensation voltage terminal is $V_{c2}$. In a similar fashion, the value at the kth compensation voltage terminal is $V_{ck}$. Among the k switch modules, one end of the ith switch module is connected to the ith compensation voltage terminal, and the other end of the ith switch acts as the output terminal of the compensation voltage selection module 13. When the selection unit 11 selects to output a signal with a voltage value at the voltage dividing output terminal of the ith voltage dividing unit 10, the ith switch module is turned on to output a signal with the voltage value $V_{ci}$. For example, one end of the first switch module is connected to the first compensation voltage terminal, and the other end acts as the output terminal of the compensation voltage selection module 13. When the selection unit 11 selects to output a signal with a voltage value of the first voltage dividing unit 10, the first switch module is turned on to output a signal with the voltage value $V_{c1}$ at the first compensation voltage terminal to the analog adder module 14. These k switch modules can be turned on and off according to the digital signal and the division rule of the voltage dividing units 10. There are many implementation ways. For example, a controller is applied. When receiving a digital signal from an interval on the Gamma curve corresponding to the interval of the analog signal output by the ith voltage dividing unit 10, the controller sends a signal to turn on the ith switch module and turn off the other switch modules. As stated above, i is a positive integer less than or equal to k. When the controller receives a digital signal from an interval on the Gamma curve corresponding to the interval of the analog signal output by the first voltage dividing unit 10, the controller sends a signal to turn on the first switch module and turn off the other switch modules. When the controller receives a digital signal from an interval on the Gamma curve corresponding to the interval of the analog signal output by the second voltage dividing unit 10, the controller sends a signal to turn on the second switch module and turn off the other switch modules, and so on.

The structure of the low-voltage digital to analog conversion circuit of the embodiment is described in detail above. In the aforementioned structure, $V_L$, $V_i$, and $V_{ci}$ are configured as follows:

$V_L$ may be configured to be a low voltage level. Preferably, $V_L$ can be 0.

Referring back to FIG. 4, k−1 different voltage values (unequal to $V_{outLow}$ and $V_{outHigh}$) are selected from $V_{outLow}$~$V_{outHigh}$, wherein the ith voltage value from the k−1 voltage values arranged in a small-to-large order is $V_{outi}$. In addition, because i is a positive integer less than or equal to k, i may be equal to k. So let $V_{outk}$ be equal to $V_{outHigh}$. Besides, for explanation purpose, let $V_{out0}$ be equal to $V_{outLow}$. As such, the configurations of $V_i$ and $V_{ci}$ are: $V_i=V_{outi}-V_{outi-1}+V_L$, $V_{ci}=V_{outi-1}-V_L$. In other words, for the first voltage dividing unit: $V_1=V_{out1}-V_{out0}+V_L$, $V_{c1}=V_{out0}-V_L$; for the second voltage dividing unit: $V_2=V_{out1}-V_{out1}+V_L$, $V_{c2}=V_{out1}-V_L$; and so on. For the last voltage dividing unit, i.e., the kth voltage dividing unit: $V_k=V_{outk}-V_{outk-1}+V_L$, $V_{ck}=V_{outk-1}-V_L$.

Preferably, when k−1 different voltage values (unequal to $V_{outLow}$ and $V_{outHigh}$) are selected from $V_{outLow}$~$V_{outHigh}$, the k−1 values may be evenly distributed in the range of $V_{outLow}$~$V_{outHigh}$, which means $V_{outLow}$ ($V_{out0}$), $V_{out1}$, $V_{out2}$, ..., $V_{outi}$, ..., $V_{outk-1}$, $V_{outHigh}$ ($V_{outk}$) is an arithmetic progression.

Refer back to FIG. 4 again. After choosing k−1 points on the vertical axis, the vertical coordinate range $V_{outLow}$~$V_{outHigh}$ is divided into k intervals. Correspondingly, the horizontal coordinate range is also divided into k intervals, the digital signal in the interval 0~① corresponds to the analog signal in the interval $V_{out0}$~$V_{out1}$, the digital signal in the interval ①~② corresponds to the analog signal in the interval $V_{out1}$~$V_{out2}$, and so on. As a result, when designing voltage dividing units 10, according to the resistor number corresponding to each interval, a resistor string similar to the one in FIG. 3 can be changed to a number of voltage dividing units 10 as required.

In order to further illustrate this embodiment, a practical example is described below to supplement this embodiment.

Figure 10:
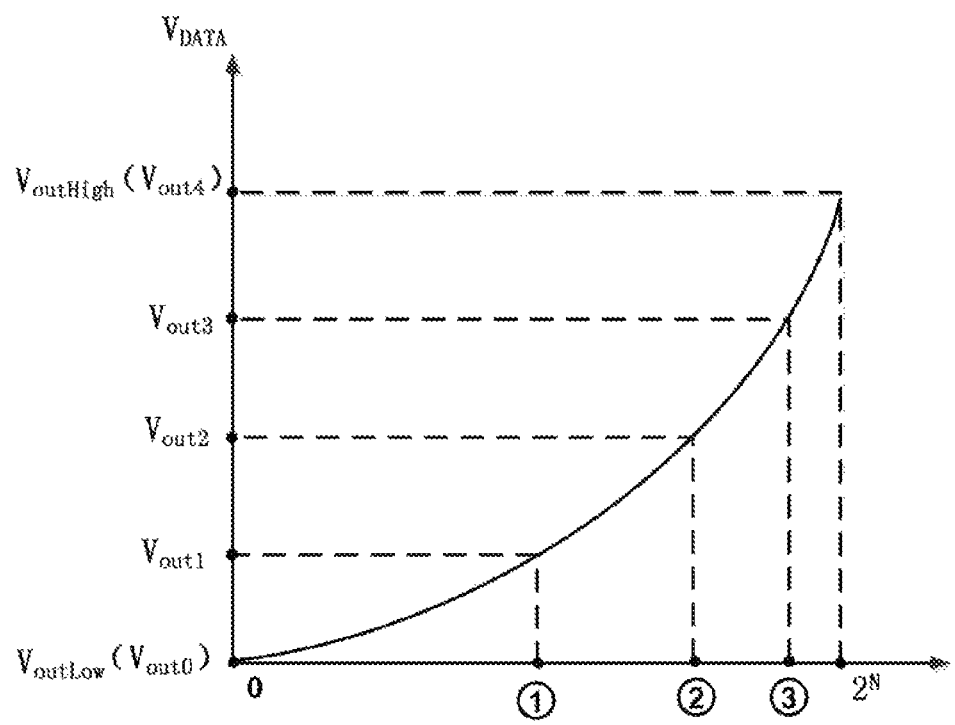
FIG. 10 illustrates a Gamma curve of a low-voltage digital signal to analog signal conversion circuit in the case of k=4 according to the present application.
Figure 11:
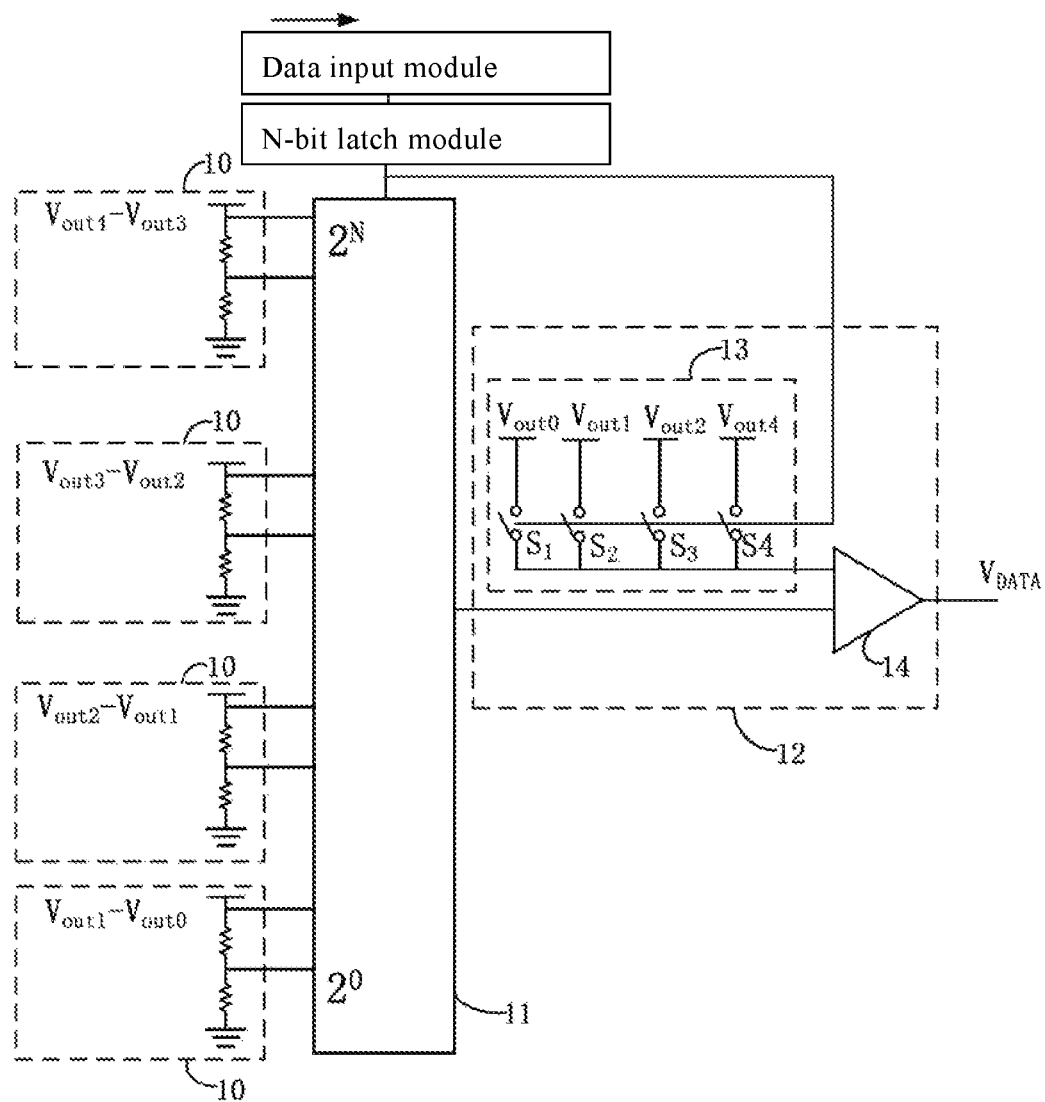
FIG. 11 illustrates a structure diagram of a low-voltage digital signal to analog signal conversion circuit in the case of k=4 according to the present application.

Please refer to FIG. 10. Similar to FIG. 4, FIG. 10 is a Gamma curve of the low-voltage digital to analog conversion circuit. When k in FIG. 4 is 4, the diagram is the same as illustrated in FIG. 10. The Gamma curve is divided into 4 sections (with vertical coordinates ranging from high to low), the voltage values are $V_{out4}$ ($V_{outHigh}$), $V_{out3}$, $V_{out2}$, $V_{out1}$, $V_{out0}$ ($V_{outLow}$) respectively. Correspondingly, the horizontal coordinates are also divided into four intervals: interval 0~①, interval ①~②, interval ②~③, and interval ③~$2^N$. The output voltage range corresponding to the digital signal of the interval 0~① is $V_{out0}$~$V_{out1}$, and the voltage difference is $V_{out1}-V_{out0}$. The output voltage range corresponding to the digital signal of the interval ①~② is $V_{out1}$~$V_{out2}$, and the voltage difference is $V_{out2}-V_{out1}$. The output voltage range corresponding to the digital signal of the interval ②~③ is $V_{out2}$~$V_{out3}$, and the voltage difference is $V_{out3}-V_{out2}$. The output voltage range corresponding to the digital signal of the interval ③~$2^N$ is $V_{out3}$~$V_{out4}$, and the voltage difference is $V_{out4}-V_{out3}$. FIG. 11 illustrates a way to implement the segmentation shown in FIG. 10. In this way, the selection unit 11 can be a pass transistor logic, and its structure remains unchanged, which is similar to the pass transistor logic (PLT) shown in FIG. 3. Different from FIG. 3, in FIG. 11, there is no such a resistor string whose two ends are connected to $V_{outLow}$ and $V_{outHigh}$ respectively. Instead, the resistor string in FIG. 3 is divided into four segments, i.e., four voltage dividing units 10. The voltage range of the first voltage dividing unit 10 is 0~$V_{out1}-V_{out0}$, which means one end of the first voltage dividing unit is grounded and the other end is connected to a voltage end with a value of $V_{out1}-V_{out0}$. The voltage range of the second voltage dividing unit 10 is 0~$V_{out2}-V_{out1}$, which means one end of the first voltage dividing unit is grounded and the other end is connected to a voltage end with a value of $V_{out1}-V_{out1}$. The voltage range of the third voltage dividing unit 10 is $0\sim V_{out3}\sim V_{out2}$, that is, one end is grounded and the other end is connected to a voltage end with a value of $V_{out3}-V_{out2}$. The voltage range of the fourth voltage dividing unit 10 is $0\sim V_{out4}-V_{out3}$, that is, one end is grounded and the other end is connected to a voltage end with a value of $V_{out4}-V_{out3}$. As a result, by segmenting the resistor string, the initial voltage output of each voltage dividing unit is reduced to zero, which can effectively lower the voltage of each voltage dividing unit. Although the whole circuit structure of the selection unit 11 is unchanged and is still similar to the pass transistor logic (PLT) shown in FIG. 3, the voltage output by each voltage dividing unit is reduced to a lower voltage range due to segmenting of the resistor string. Therefore, the related devices in selection unit 11 (such as a pass transistor logic), the transistor can be implemented by a low-voltage technology, so that the selection unit 11 becomes a low-voltage device with the characteristics of low power consumption and small chip area.

As stated above, a data input module inputs a N-bit digital signal via a N-bit latch module, and the selection unit 11 selects an analog signal having a corresponding voltage value according to the input N-bit digital signal. The voltage value is not the original display voltage, but is a voltage pulled down to a voltage value in a lower voltage range due to the segmenting of the resistor string. In order to make the final display signal to be the original display voltage, it is required to pull the pulled-down voltage portion back up. Pulling the pulled-down voltage back up to the original display voltage can be implemented by a compensation voltage selection module 13 and an analog adder module 14.

The analog adder module 14 includes at least two input terminals, wherein one input terminal is connected to the output terminal of the selection unit 11, and the other input terminal is connected to the compensation voltage selection module 13. The compensation voltage selection module 13 outputs the voltage loss due to the Gamma curve or the resistor string segmentation. Because the Gamma curve is divided into four sections, there are four voltage values to choose, which are respectively controlled by switches $S_1$, $S_2$, $S_3$, and $S_4$. When the input digital signal is in the interval $0\sim①$, $S_1$ is turned on and the other switches are turned off; when the input digital signal is in the interval ①~②, $S_2$ is turned on and the other switches are turned off, and so on. In this way, in the analog adder module 14, the pulled-down voltage signal is recovered. Switches $S_1$, $S_2$, $S_3$, and $S_4$ herein refer to devices with switch function. Switches $S_1$, $S_2$, $S_3$, and $S_4$ are turned on and off according to the digital signal and the division rule of the voltage dividing units 10, and have many implementation ways. For example, a controller is applied. When receiving a digital signal in the interval $0\sim①$, the controller turns on the switch $S_1$, and turns off the other switches; when receiving a digital signal in the interval ①~②, the controller turns on the switch $S_2$, and turns off the other switches; when receiving a digital signal in the interval ②~③, the controller turns on the switch $S_3$, and turns off the other switches; when receiving a digital signal in the interval ③~$2^N$, the controller turns on the switch $S_4$, and turns off the other switches.

In this supplementary example, the resistor string is divided into four voltage dividing units 10, i.e., k=4. In other embodiments, as stated above, the resistor string can also be divided into k voltage dividing units 10. The greater k is, the smaller the voltage range output by each voltage dividing unit 10 is, so that the voltage dividing unit 10 can be driven by even lower voltages.

It should be noted that, in this embodiment, k is set to be an integer greater than 1. However, k can also be equal to 1, that is, the low-voltage digital to analog conversion circuit comprises one voltage dividing unit 10. The description in connection with FIG. 12 is below.

Figure 12:
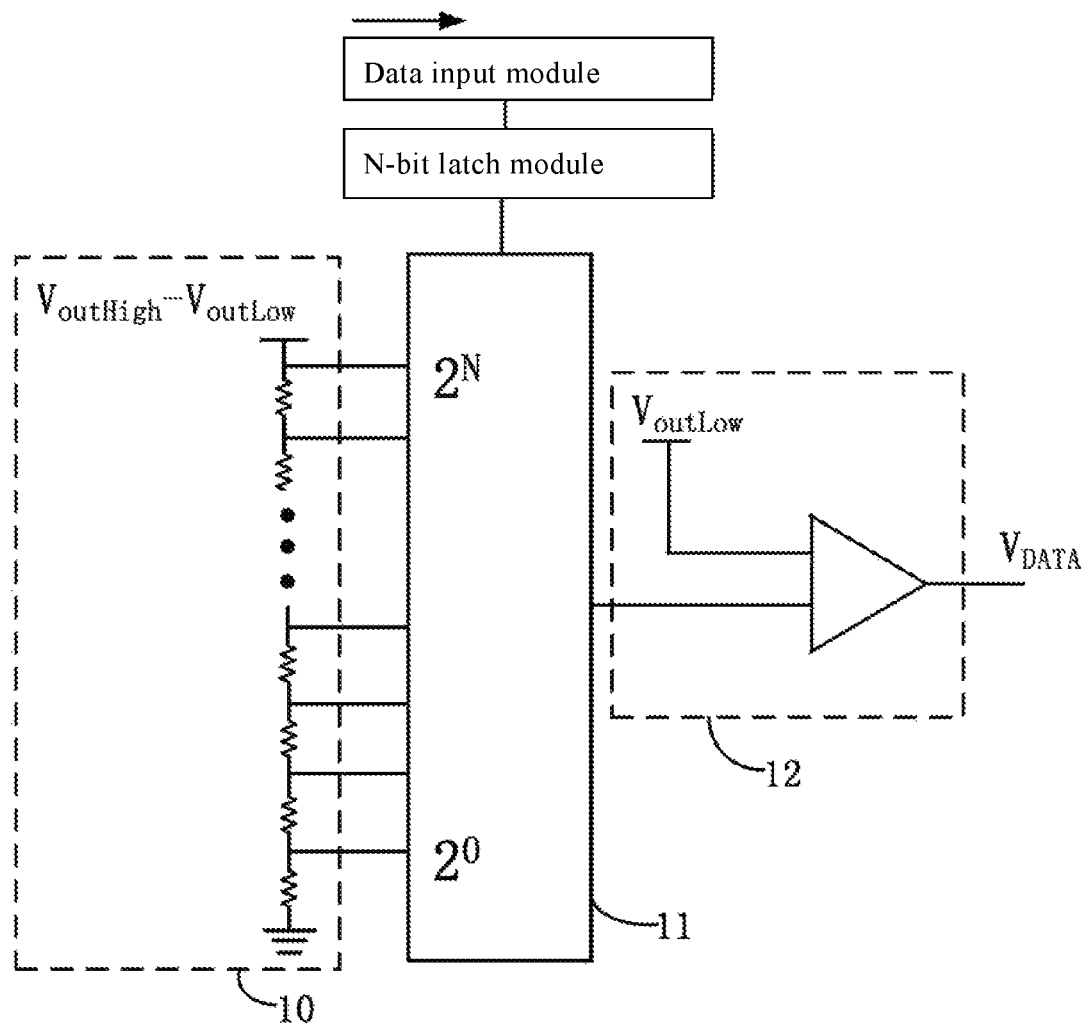
FIG. 12 illustrates a structure diagram of a low-voltage digital signal to analog signal conversion circuit in the case of k=1 according to the present application.

Please refer to FIG. 12. One end of a voltage dividing unit 10 is connected to a low voltage $V_L$, and the other end is connected to a voltage end with a value of $V_{outHigh}-V_{outLow}+V_L$, for outputting a signal from the voltage range of $V_L\sim V_{outHigh}-V_{outLow}+V_L$. Preferably, $V_L$ may be equal to 0. Then, one end of the voltage dividing unit 10 is grounded and the other end is connected to a voltage end with a value of $V_{outHigh}-V_{outLow}$.

A selection unit 11 is configured to select a signal with a voltage value of the voltage dividing unit 10 for output according to the input digital signal.

A voltage compensation unit 12 is configured to, when the selection unit 11 selects to output a signal with a voltage value of the voltage dividing unit 10, compensate the signal output by the selection unit 11 with a voltage value $V_{outLow}-V_L$ and then output the compensated signal. As stated above, if $V_L$ is 0, the voltage compensation unit 12 compensates the signal output by the pass transistor logic 11 with a voltage value $V_{outLow}$. The voltage compensation unit 12 can be implemented by an adder module. One input terminal of the adder module is connected to the output terminal of the pass transistor logic 11, and the other input terminal is connected to a reference voltage having a value of $V_{outLow}$.

The above low-voltage digital to analog conversion module can be applied to other products in addition to the data driving circuit of a display.

Specific embodiments are used to illustrate the present application. These embodiments are merely used to help to understand the present application and are not to be constructed as limiting the present application. Those skilled in the art can make various variations to the above specific embodiments according to the application concept.

What is claimed is:

1. A low-voltage digital to analog conversion circuit, characterized in that, comprising:

K voltage dividing units, wherein an ith of the dividing units comprises at least two resistors connected in series between a same low reference voltage $V_L$ and an upper limit of voltage $V_i$, and voltage dividing output terminals are drawn from one of the interconnection nodes of the resistors and a connection end of the upper limit of voltage $V_i$, wherein K is an integer greater than 1, i is an integer greater than 1 and no more than K, wherein $V_i$ is greater than the low reference voltage $V_L$ and $V_i$ increase as i increases, when i=K, $V_k$ equals a high reference voltage;

a selection unit, coupled to the voltage dividing output terminals of each voltage dividing unit, the selection unit is configured to input a digital signal, select to activate one from the voltage dividing output terminals under the control of the digital signal, and output a voltage signal to be compensated at the voltage dividing output terminal; and a voltage compensation unit, coupled to the selection unit and configured to input the voltage signal to be compensated and the digital signal respectively, and to compensate the voltage signal to be compensated according to the digital signal, so that the compensated voltage is an analog voltage corresponding to the digital signal, wherein the voltage compensation unit comprises
  a compensation voltage selection module configured to output a compensation signal according to the digital signal and the division rules of the voltage dividing unit, the compensation signal is used to compensate the voltage signal to be compensated, wherein the compensation signal is higher than the voltage signal to be compensated, wherein at least the selection unit is implemented with low-voltage devices, and
  wherein the compensation voltage selection module comprises
    compensation voltage terminals, a number of the compensation voltage terminals is the same as that of the voltage dividing units, and values of voltages at the compensation voltage terminals are equal to the voltage values for compensation required by the voltage signal to be compensated at the voltage dividing output terminals of each voltage dividing unit.

2. The low-voltage digital to analog conversion circuit of claim 1, characterized in that, the voltage compensation unit is configured to determine a compensation value of the voltage signal to be compensated according to the digital signal and division rules of the voltage dividing units, and to add the voltage signal to be compensated to the compensation value for output.

3. The low-voltage digital to analog conversion circuit of claim 1, characterized in that, the selection unit comprise a pass transistor logic, each switch circuit formed by the pass transistor logic corresponding to the voltage dividing output terminal of each voltage dividing unit, configured to connect the voltage dividing output terminals with the output terminals of the selection unit.

4. The low-voltage digital to analog conversion circuit of claim 1, characterized in that, there are at least two voltage dividing units.

5. A data driving circuit, characterized in that, comprising:
  a data input module configured to input a digital signal comprising image data;
  a latch coupled to the data input module configured to lock the digital signal;
  a low-voltage digital to analog conversion circuit according to claim 1, input terminals of the selection unit and the voltage compensation unit thereof are coupled to an output terminal of the latch.

6. The low-voltage digital to analog conversion circuit of claim 2, characterized in that, the voltage compensation unit comprises:
  an analog adder module, with one input terminal connected to the output terminal of the selection unit and the other input terminal connected to the output terminal of the compensation voltage selection module, the analog adder module is configured to add the voltage signal to be compensated output by the selection unit to a voltage of the compensation signal output by the compensation voltage selection module for output; a signal output by the analog adder module acts as a signal output by the voltage compensation unit.

7. The low-voltage digital to analog conversion circuit of claim 6, characterized in that, the compensation voltage selection module comprises:
  switch modules, a number of which is the same as that of the compensation voltage terminals, with one switch module being coupled to one compensation voltage terminal, wherein one end of the switch module is coupled to a compensation voltage terminal, and the other end is coupled to an input terminal of the analog adder module, a control terminal of the switch module is configured to input the digital signal and the switch module is turned on and off under control of the digital signal so as to output the compensation signal.

8. The low-voltage digital to analog conversion circuit of claim 6, characterized in that, the analog adder module comprises:
  two voltage-to-current conversion modules, an input terminal of one voltage-to-current conversion module acts as an input terminal of the analog adder module for converting the voltage signal to be compensated output by the selection unit to a current signal for output; an input terminal of the other voltage-to-current conversion module acts as the other input terminal of the analog adder module for converting the compensation signal output by the compensation voltage selection module to a current signal for output;
  an adder node, configured to add the current signals output by the two voltage-to-current conversion modules for output;
  a current-to-voltage conversion module, an output terminal of which acts as the output terminals of the analog adder module, configured to convert a current signal output by the adder node to a voltage signal for outputs.

9. The low-voltage digital to analog conversion circuit of claim 6, characterized in that, the analog adder module comprises:
  an amplifier, wherein a positive input terminal of the amplifier is grounded, and a capacitor C3 is coupled between a negative input terminal and an output terminal, a switch $S_{11}$ is coupled in parallel with the capacitor C3, the negative input terminal of the amplifier is also coupled to a grounded switch $S_{22}$ through a capacitor C1, the capacitor C1 is also coupled to a switch $S_{12}$ at a node where the capacitor C1 is coupled with the grounded switch $S_{22}$, the other end of the switch $S_{12}$ acts as an input terminal of the analog adder module; the negative input terminal of the amplifier is also coupled to a grounded switch $S_{21}$ through a capacitor C2, the capacitor C2 is also coupled to a switch $S_{13}$ at a node where the capacitor C2 is coupled with the switch $S_{21}$, the other end of the switch $S_{13}$ acts as the other input terminal of the analog adder module;
  or
  an amplifier, wherein a positive input of the amplifier is grounded, and a switch $S_{11}$ is coupled between a negative input and an output terminal of the amplifier, the negative input terminal of the amplifier is coupled to one end of a capacitor C2, and the other end of the capacitor C2 is coupled to the output terminal of the amplifier through a switch $S_{21}$; the capacitor C2 is coupled to one end of the switch $S_{21}$, and also coupled to one end of a switch $S_{13}$, the other end of the switch $S_{13}$ acts as an input terminal of the analog adder module; the negative input terminal of the amplifier is also coupled to a grounded switch $S_{22}$ through a capacitor C1, the capacitor C1 is also coupled to one end of a switch $S_{12}$ at a node where the capacitor C1 is coupled with the grounded switch $S_{22}$, the other end of the switch $S_{12}$ acts as the other input terminal of the analog adder module;
  or
  an amplifier, wherein a resistor R1 is coupled between a negative input terminal and an output terminal of the amplifier; the negative input terminal of the amplifier is also coupled to a grounded resistor R2; a positive input terminal of the amplifier is coupled to one end of a resistor R3, and the other end of the resistor R3 acts as an input terminal of the analog adder module; the positive input terminal of the amplifier is coupled to one end of a resistor R4, and the other end of the resistor R4 acts as the other input terminal of the analog adder module; wherein the resistances of the resistors R2, R3, and R4 are the same, and the resistance of the resistor R1 is twice of the resistance of the resistor R2.

10. A display system comprising a display that is coupled with at least a data driving circuit according to claim 5.

* * * * *